United States Patent
Lin et al.

(10) Patent No.: US 11,195,915 B2
(45) Date of Patent: Dec. 7, 2021

(54) SEMICONDUCTOR DEVICES WITH A SLOPED SURFACE

(71) Applicant: TEXAS INSTRUMENTS INCORPORATED, Dallas, TX (US)

(72) Inventors: Haian Lin, Bethlehem, PA (US); Frank Alexander Baiocchi, Allentown, PA (US); Seetharaman Sridhar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/384,700

(22) Filed: Apr. 15, 2019

(65) Prior Publication Data

US 2020/0328275 A1 Oct. 15, 2020

(51) Int. Cl.
| | |
|---|---|
| *H01L 29/78* | (2006.01) |
| *H01L 29/08* | (2006.01) |
| *H01L 29/06* | (2006.01) |
| *H01L 29/66* | (2006.01) |
| *H01L 29/40* | (2006.01) |
| *H01L 29/423* | (2006.01) |

(52) U.S. Cl.
CPC ...... *H01L 29/0878* (2013.01); *H01L 29/0607* (2013.01); *H01L 29/402* (2013.01); *H01L 29/42356* (2013.01); *H01L 29/66674* (2013.01); *H01L 29/7816* (2013.01); *H01L 29/7834* (2013.01)

(58) Field of Classification Search
CPC ............. H01L 29/0878; H01L 29/0607; H01L 29/7835; H01L 29/7834; H01L 29/402; H01L 29/7816; H01L 29/66674–66734; H01L 29/7801–7826; H01L 29/04–045; H01L 29/16–1608; H01L 29/18–185; H01L 29/22–2206; H01L 29/36–365; H01L 29/0856–0869; H01L 29/0873–0886; H01L 29/7833–7836; H01L 29/66568–66659
See application file for complete search history.

(56) References Cited

U.S. PATENT DOCUMENTS

| | | | | |
|---|---|---|---|---|
| 5,362,979 | A | * 11/1994 | Merchant | H01L 29/66772 257/340 |
| 5,780,900 | A | * 7/1998 | Suzuki | H01L 29/0873 257/335 |
| 2004/0155284 | A1 | * 8/2004 | Kim | H01L 27/11568 257/324 |

(Continued)

*Primary Examiner* — Errol V Fernandes
*Assistant Examiner* — Jeremy J Joy
(74) *Attorney, Agent, or Firm* — Jacqueline J. Garner; Charles A. Brill; Frank D. Cimino

(57) ABSTRACT

In some examples, a semiconductor device, comprises a semiconductor substrate; an epitaxial layer having a top side disposed on the semiconductor substrate, wherein the epitaxial layer has a source implant region, a drain implant region, a first doped region, and a second doped region, wherein the first doped region is adjacent to the source implant region and the second doped region is adjacent to the drain implant region, wherein the top side has a sloped surface over the second doped region; a gate electrode supported by the top side; a source electrode in contact with the source implant region; and a drain electrode in contact with the drain implant region.

19 Claims, 7 Drawing Sheets

(56) References Cited

U.S. PATENT DOCUMENTS

| | | | |
|---|---|---|---|
| 2007/0034944 A1* | 2/2007 | Xu | H01L 29/402 257/335 |
| 2008/0290408 A1* | 11/2008 | Hsu | H01L 29/7824 257/335 |
| 2014/0179079 A1* | 6/2014 | Huang | H01L 29/0607 438/286 |
| 2014/0284701 A1* | 9/2014 | Korec | H01L 29/872 257/328 |
| 2015/0041891 A1* | 2/2015 | Huang | H01L 29/0847 257/339 |
| 2015/0357404 A1* | 12/2015 | Sato | H01L 29/7816 257/339 |
| 2016/0141398 A1* | 5/2016 | Mallik | H01L 29/66356 257/105 |
| 2016/0315188 A1* | 10/2016 | Disney | H01L 29/0653 |
| 2018/0175192 A1* | 6/2018 | Fujii | H01L 29/42368 |
| 2019/0131390 A1* | 5/2019 | Huang | H01L 29/66659 |

\* cited by examiner

SEMICONDUCTOR DEVICES WITH A SLOPED SURFACE

SUMMARY

In accordance with at least one example of the disclosure, a semiconductor device, comprises a semiconductor substrate; an epitaxial layer having a top side disposed on the semiconductor substrate, wherein the epitaxial layer has a source implant region, a drain implant region, a first doped region, and a second doped region, wherein the first doped region is adjacent to the source implant region and the second doped region is adjacent to the drain implant region, wherein the top side has a sloped surface over the second doped region; a gate electrode supported by the top side; a source electrode in contact with the source implant region; and a drain electrode in contact with the drain implant region.

In accordance with at least some examples, a method of fabricating a semiconductor device, comprises obtaining a semiconductor substrate including an epitaxial layer disposed over the semiconductor substrate; forming a sloped surface in a top side of the epitaxial layer; forming a gate electrode supported by the epitaxial layer; forming a first doped region in the epitaxial layer; forming source and drain implant regions in the epitaxial layer; and forming source and drain electrodes.

BRIEF DESCRIPTION OF THE DRAWINGS

For a detailed description of various examples, reference will now be made to the accompanying drawings in which.

DETAILED DESCRIPTION

Power metal-oxide-semiconductor field-effect-transistors (MOSFETs) are widely used as electric switches for high frequency and/or high voltage applications. Power MOSFETs with suitable ratings and characteristics are selected based on the application in which they will be employed. For example, in some high-voltage applications, such as voltage regulators, laterally-diffused (LD) MOSFETs may be employed, and in such applications, on-resistance is one of the chief design concerns. On-resistance ($R_{ON}$) is the total resistance experienced by the channel carriers while traveling between drain and source implant regions of the MOSFET.

A lightly doped drain (LDD) region is implanted in LD MOSFETs to increase their breakdown voltage. The LDD region is typically adjacent to the drain implant region that has relatively higher doping concentration than the LDD region. On-resistance of a MOSFET including an LDD region is higher than the on-resistance of a MOSFET without an LDD region. This is because the presence of an LDD region adjacent to the highly doped drain implant region forms a point of congestion for the channel carriers at a region where the channel carriers encounter the LDD region. This point of congestion increases the on-resistance of the MOSFET having the LDD region. The increased on-resistance is undesirable. The increased resistance due to the congestion region is sometimes herein referred to as spreading resistance. A modified MOSFET design is needed to reduce the on-resistance of MOSFETs including LDD regions.

Accordingly, at least some examples disclosed herein are directed to LD MOSFETs implemented using a modified design, which provides additional degree of freedom to the channel carriers, and thus, reduces the spreading resistance. The reduced spreading resistance in effect reduces the on-resistance of such the LD MOSFET. In at least some examples, a sloped surface in the modified MOSFET design provides more degree of freedom to the channel carriers after the point of congestion.

Figure 1A:
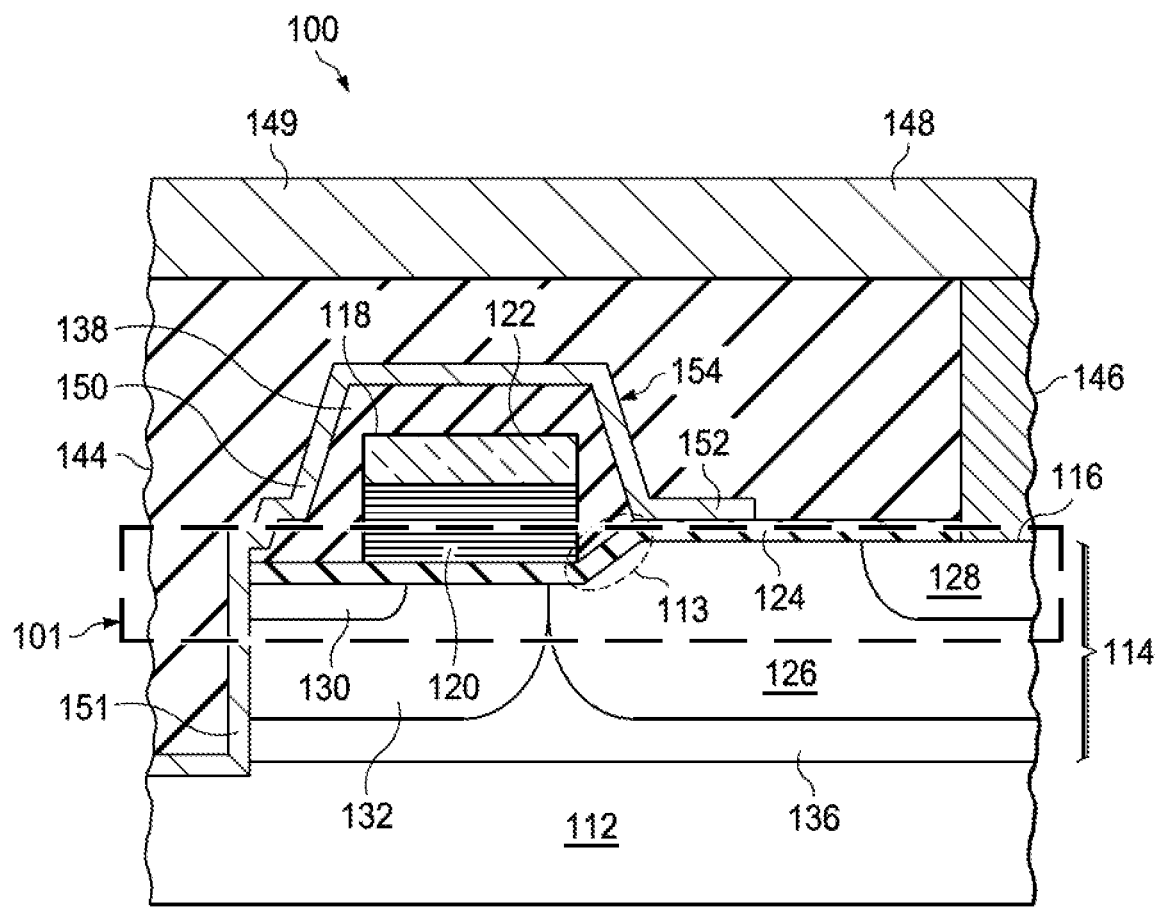
FIG. 1(a) depicts an illustrative laterally-diffused metal-oxide-semiconductor field-effect-transistor (MOSFET), in accordance with various examples.

FIG. 1(a) depicts an illustrative LD MOSFET 100 semiconductor device, in particular, an n-channel LD MOSFET semiconductor device. The following description is directed towards an n-channel semiconductor device, but the description can be suitably adapted and applied to a p-channel semiconductor device.

LD MOSFET 100 includes a semiconductor substrate 112, which, in an example, may be a highly-doped silicon wafer. In the example shown, the semiconductor substrate 112 is doped using p-type dopants, such as boron. In some examples, the semiconductor substrate 112 is doped with a dopant concentration greater than or equal to $1 \times 10^{18}$ atoms/cm$^3$.

The LD MOSFET 100 also includes an epitaxial layer 114 having a top side 116, where the epitaxial layer 114 is disposed on the semiconductor substrate 112. The epitaxial layer 114 is relatively thick, which increases a magnitude of the breakdown voltage of the LD MOSFET 100. In some examples, epitaxial layer 114 may have a thickness of about 1 to 8 um. The epitaxial layer 114, in some examples, includes silicon. In some examples, the epitaxial layer 114 includes regions that are doped with dopants of n (e.g., arsenic or phosphorous) or p (e.g., boron) dopant type, where these regions may have different dopant concentrations. For example, the epitaxial layer 114 includes a region 136 that is doped with p-type dopants and has a p-type dopant concentration of $1 \times 10^{15}$ to $5 \times 10^{16}$ atoms/cm$^3$. The epitaxial layer 114 further includes a source implant region 130, a drain implant region 128, a first doped region 132, and a second doped region 126. Both the drain and source implant regions 128, 130, respectively, extend from the top side 116 into the epitaxial layer 114, are doped with n-type dopants, and may have a doping concentration of $1 \times 10^{18}$ to $5 \times 10^{19}$ atoms/cm$^3$.

In the example device shown in FIG. 1(a), the first doped region 132 extends from the top side 116 into the epitaxial layer 114, has a depth of 0.3 to 2 um, and surrounds a portion of the source implant layer 130. In some examples, the depth of the first doped region 132 is similar to the depth of the epitaxial layer 114. The first doped region 132 can also be sometimes referred to as being adjacent to the source implant region 130. In some examples, the first doped region 132 is doped with p-type dopants and has a dopant concentration of $5 \times 10^{16}$ to $1 \times 10^{18}$ atoms/cm$^3$. First doped region 132 forms the body region of LD MOSFET 100.

In the example semiconductor device shown in FIG. 1(a), the second doped region 126 is a lightly-doped drain (LDD) region, which forms an enhanced drift region adjacent to more heavily doped drain implant region 128. The LDD region increases the drain-to-source breakdown voltage of the LD MOSFET 100. In the illustrative example shown in FIG. 1(a), the second doped region 126 is doped using n-type dopants and has a dopant concentration that is less than the doping concentration of the drain implant region 128. In some examples, the second doped region has a dopant concentration of $5 \times 10^{16}$ to $1 \times 10^{18}$. In some examples, the second doped region 126 extends from the top side 116 into the epitaxial layer 114, has a depth of 0.2 um to 1 um and surrounds a portion of the drain implant layer 128. In some examples, the depth of the second doped region 126 is similar to the depth of the epitaxial layer 114. The top side 116 has a sloped surface 113 over the second doped region 126. The sloped surface 113 provides more degree of freedom to the channel carriers travelling between the source and drain implant regions 130, 128, respectively. This reduces the on-resistance of the LD MOSFET 100, and the principles of physics of this phenomenon are further described ahead in FIG. 1(b).

LD MOSFET 100 further includes a gate electrode 118, which, in some examples, comprises a doped polysilicon layer 120 with an upper silicide layer 122 formed therein or thereover. In some examples, the silicide layer 122 may be comprised of a transition metal silicide and can include titanium, tungsten, and cobalt. The gate electrode 118 is fabricated over a gate dielectric layer 124, which may comprise silicon dioxide. In some examples, the gate dielectric layer 124 is formed to a thickness of about 100 to 500 Å. The gate electrode 118 is supported by top side 116. The term "support" or "supported by" used in this disclosure is intended to mean either indirect or direct support. Thus, if gate electrode 118 is supported by the top side 116, that support may be through direct support with the top side 116 or through indirect support via other layers. The gate electrode 118 is positioned above a portion of the first doped region 132 and a portion of the second doped region 126, and the gate electrode 118 is laterally positioned with respect to the sloped surface 113.

LD MOSFET 100 also includes a continuous conductive layer 154 that forms a source electrode 151, a gate shield 150, and a field plate 152 for the LD MOSFET 100. The continuous conductive layer 154 extends from the semiconductor substrate 112 over an insulation (or insulating) layer 138, over gate electrode 118, and the sidewall spacers (not expressly shown in FIG. 1(a)) of the gate electrode 118 to form the gate shield 150, which shields the gate electrode 118 and source implant region 130 from the drain implant region 128. Still further, the continuous conductive layer 154 extends over a portion of the insulation layer 138 that is formed over second doped region 126 to form the field plate 152. The field plate 152 can also be said to be supported by the epitaxial layer 114. The field plate 152, in some examples, functions to spread the otherwise high localized electric field from near the gate electrode 118 towards the drain implant region 128. The source electrode 151 portion of the continuous conductive layer 154 is in contact with the source implant region 130. In some examples, the insulating layer 138 may comprise $SiO_2$ or $SiO_xN_y$. In other examples, insulating layer 138 can comprise several layers of insulating materials that collectively form the insulating layer 138. A portion marked with numeral 101 is further described in FIG. 1(b).

The continuous conductive layer 154, in some examples, includes one or more stacked conductive layers or materials. In one example, the continuous conductive layer 154 includes Ti/TiN combination layers with thickness range between about 0.1-0.3 um.

LD MOSFET 100 also includes a conducting metal stack 148 that forms a drain electrode 146. A horizontal portion 149 of the conducting metal stack 148 covers an insulation layer 144. The drain electrode 146 is in contact with the drain implant region 128. In some examples, the conducting metal stack 148 comprises tungsten, titanium, and/or titanium nitride (or aluminum alloy). In some examples, the insulation layer 144 may comprise one or more dielectric layers and can comprise of $SiO_2$ or $SiO_xN_y$.

Figure 1B:
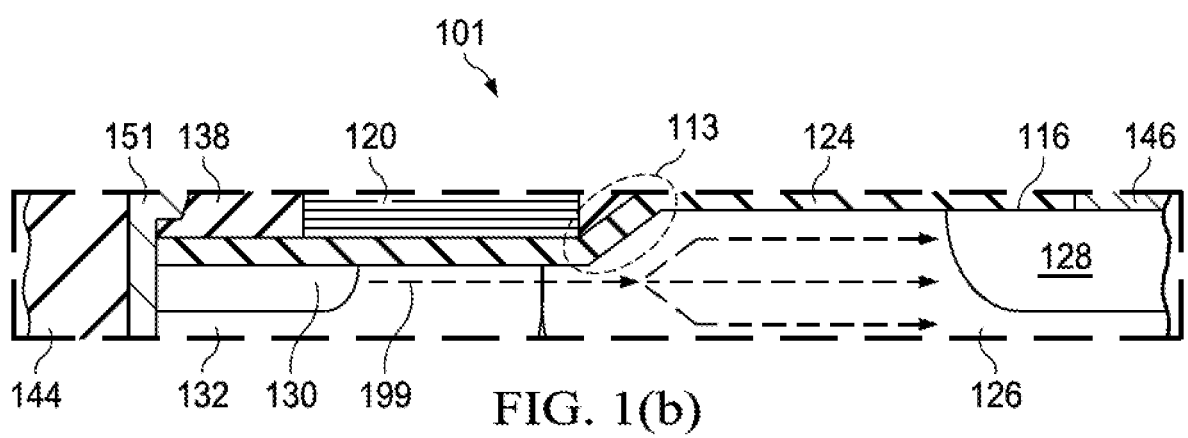
FIG. 1(b) depicts a portion of the laterally-diffused metal-oxide-semiconductor field-effect-transistor showing a sloped surface, in accordance with various examples.

Refer now to FIG. 1(b), which depicts the portion 101 marked in FIG. 1(a). The portion 101 depicts the top side 116, portions of insulating layers 138, 144; and the source and drain implant regions 130, 128, respectively. The portion 101 also depicts the gate dielectric layer 124; portions of the source electrode 151, first doped region 132, second doped region 126, and polysilicon layer 120. FIG. 1(a) also depicts the sloped surface 113 that is present over the second doped region 126.

In operation, as a suitable voltage is applied to the gate electrode 118 (FIG. 1(a)), a channel 199, with electrons as its primary carrier forms between the source and drain implant regions 130, 128, respectively. The portion of the channel formed in the first doped region 132 electrically contacts the second doped region 126. Because of the presence of the sloped surface 113, channel 199 is recessed and the carriers of the channel 199 now have a greater degree of freedom to spread both up and down into the region 126 and thus reduce the spreading resistance. As a comparison, for a device without the sloped surface 113, the carriers from the channel 199 can only spread down into the region 126, and therefore, has more spreading resistance.

The parasitic capacitance between the gate electrode 118 and the second doped region 126 is an important parameter for the switching performance of the LD MOSFET 100. The slope—or the angle between the sloped surface 113 and the top side 116—of the sloped surface 113 may be varied to control the parasitic capacitance. In some examples, there may be a trade-off between the parasitic capacitance and the spreading resistance.

Figure 2A:
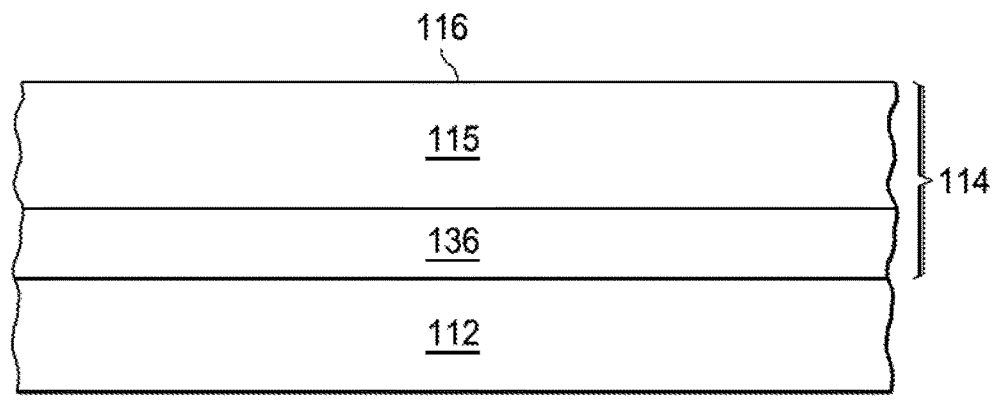
FIGS. 2(a)-2(k) depict cross-sectional side-views of the laterally-diffused metal-oxide-semiconductor field-effect-transistor at various stages of an illustrative fabrication process, in accordance with various examples.
Figure 2B:
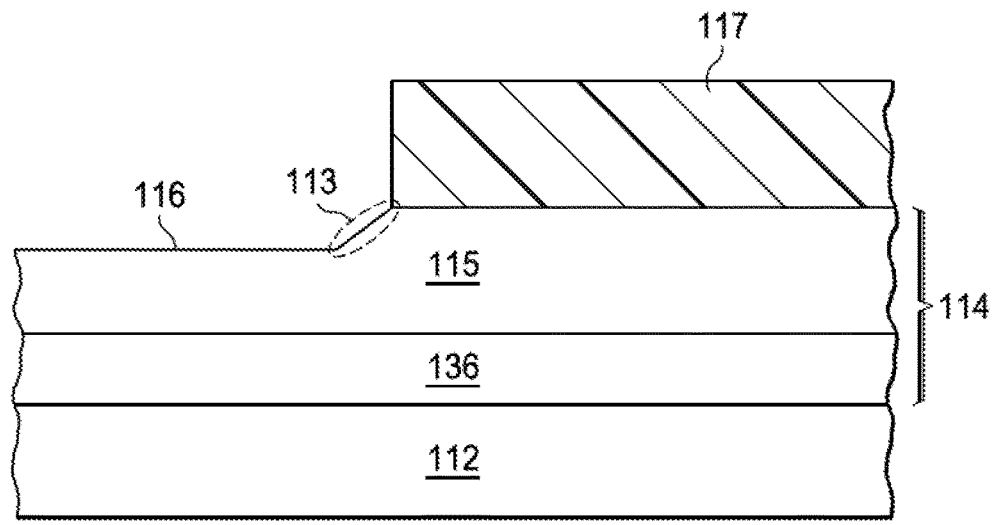
Figure 2C:
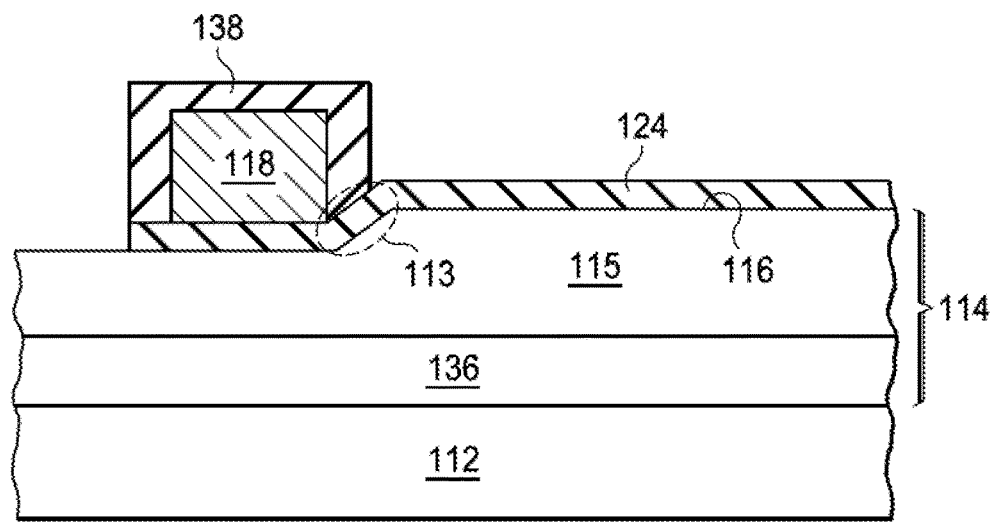
Figure 2D:
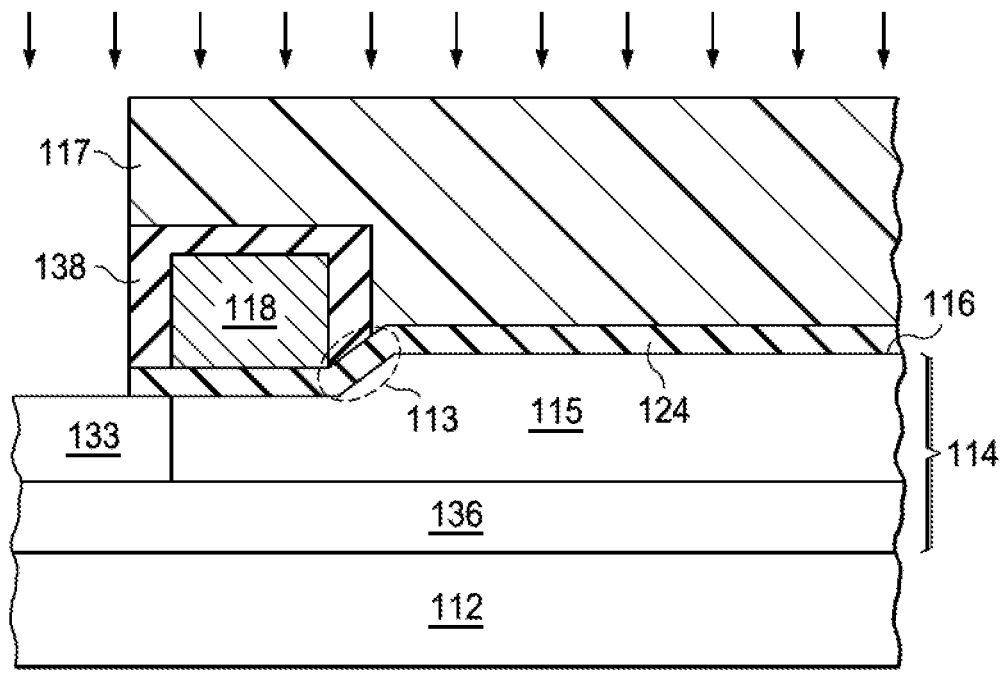
Figure 2E:
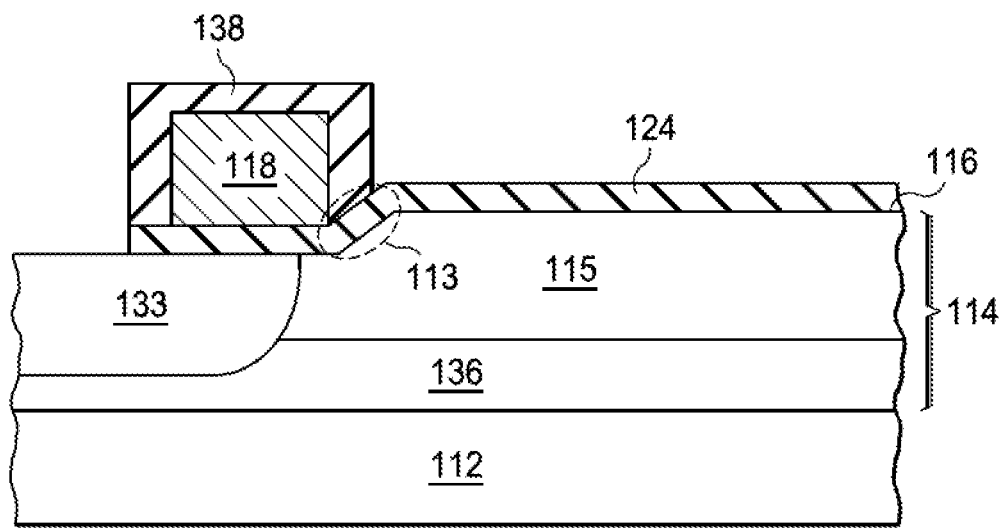
Figure 2F:
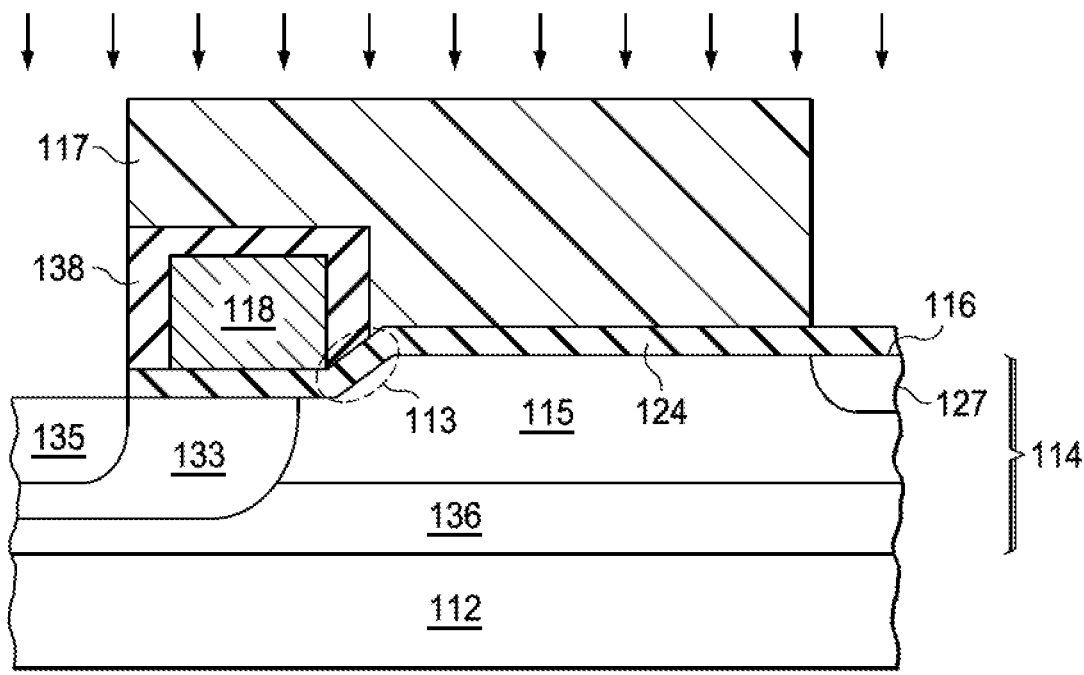
Figure 2G:
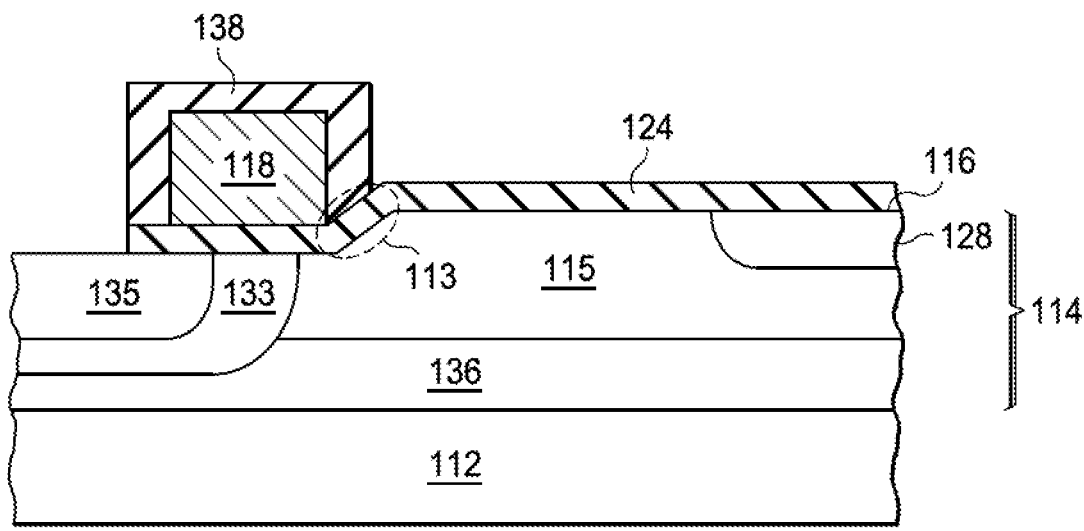
Figure 2H:
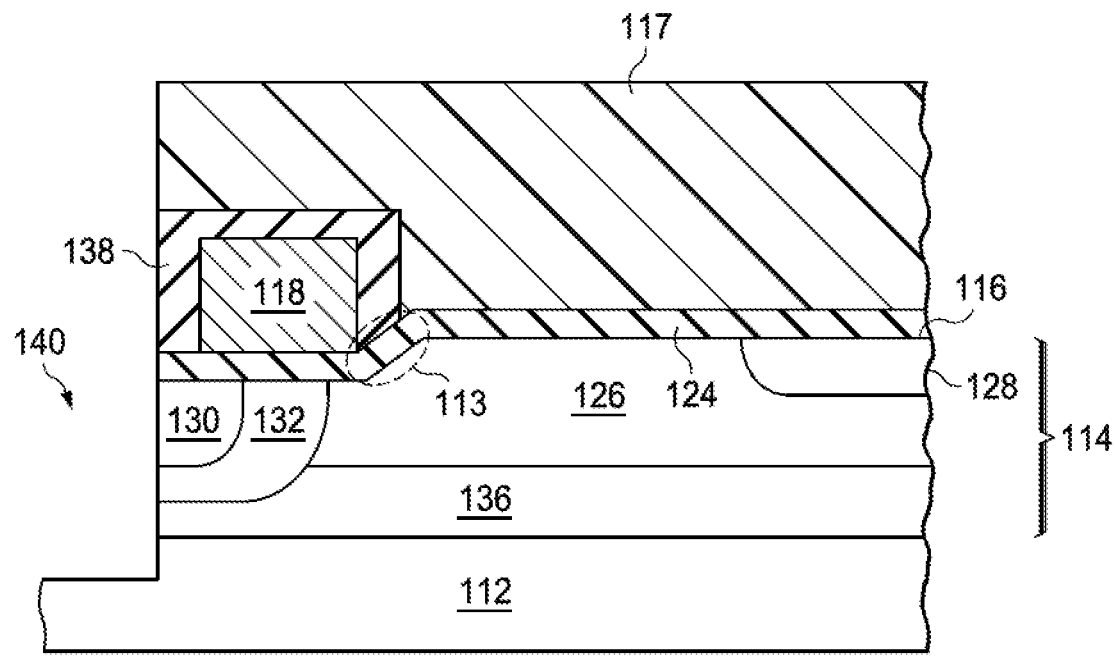
Figure 2I:
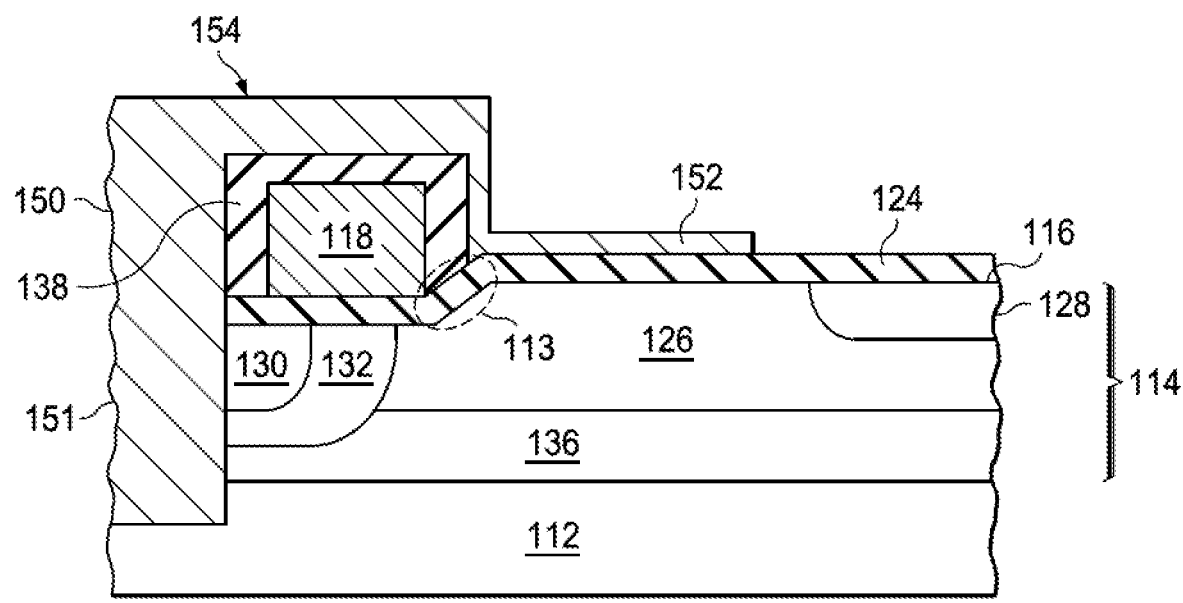
Figure 2J:
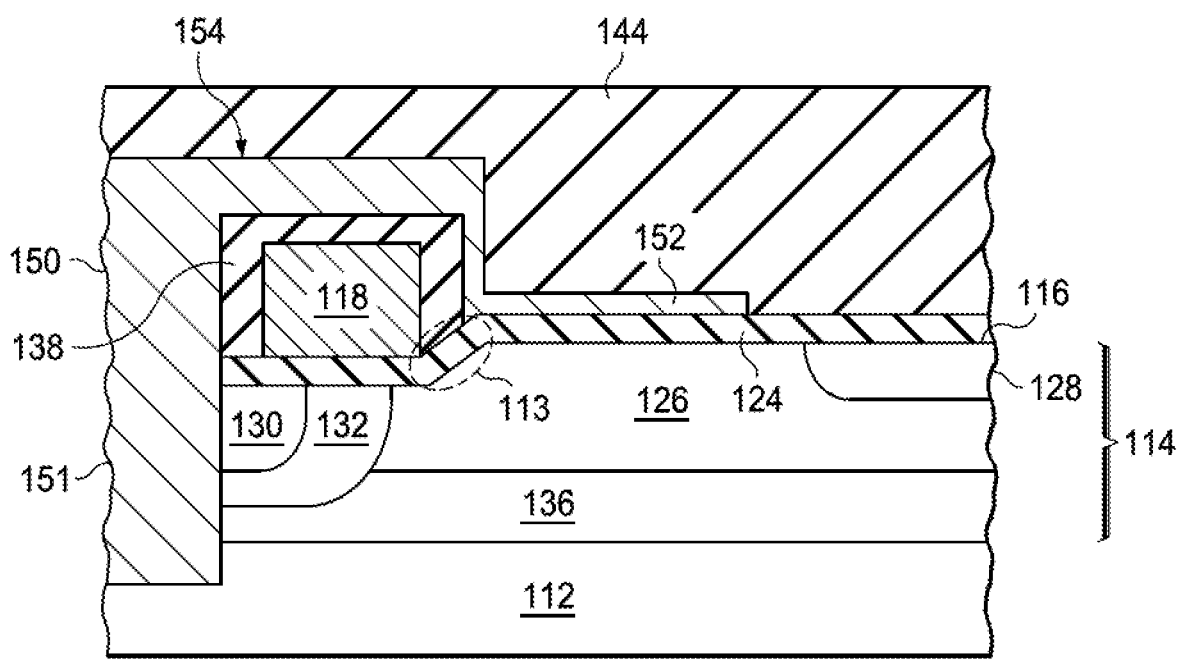
Figure 2K:
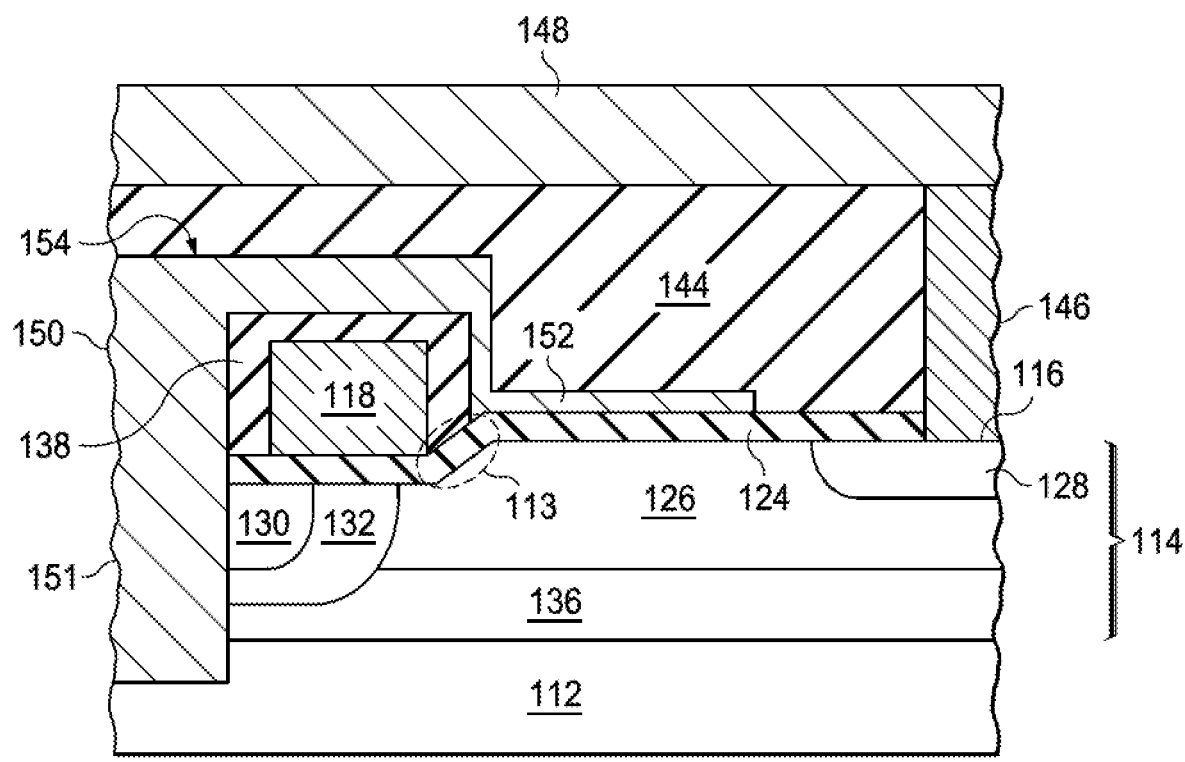
Figure 3:
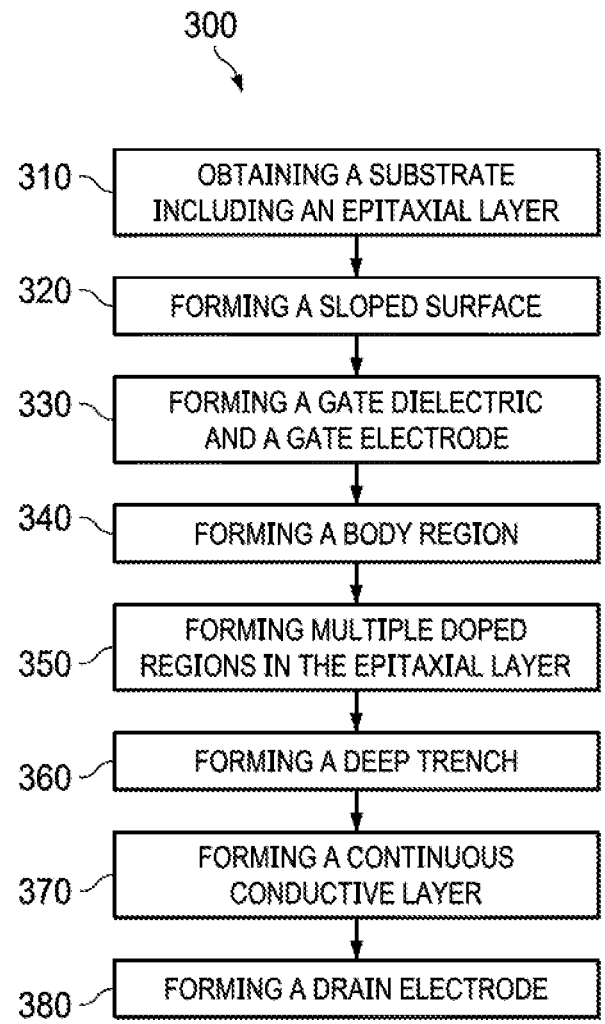
FIG. 3 depicts an illustrative method of fabrication of the laterally-diffused metal-oxide-semiconductor field-effect-transistor, in accordance with various examples.

Referring now to FIG. 3, illustrative method 300 to fabricate LD MOSFET 100 is shown. The method 300 is described in tandem with FIGS. 2(a)-2(k), which are cross-sectional side-views of LD MOSFET 100 at various stages of the fabrication process. The method 300 begins with a step 310 (FIG. 2(a)) that includes obtaining a substrate 112 with an overlaying epitaxial layer 114. The epitaxial layer 114 has a top side 116 and may include one or more epitaxially grown layers, such as epitaxial layer 136 (or region 136) and epitaxial layer 115. The epitaxial layers 136, 115 include silicon and may be grown using molecular-beam epitaxy, or related techniques. Epitaxial layers 136, 115 can be doped during epitaxial deposition by adding impurities to the source gas, such as arsine, phosphine, or diborane. The concentration of impurity in the gas phase determines its concentration in the deposited film. For example, during epitaxial growth of the region (or epitaxial layer) 136, boron (p-type dopant) is added to dope the region 136 to the desired dopant concentration (e.g., $1 \times 10^{15}$ to $5 \times 10^{16}$ atoms/$cm^3$). Similarly, epitaxial layer 115 is doped using phosphorus (n-type dopant) to a desired dopant concentration (e.g., $1 \times 10^{15}$ atoms/$cm^3$). In some instances, the epitaxial layer 115 may be referred to as an n-type lightly doped layer. In some instances, epitaxial layer 115 may also be doped by ion implantation process, using arsenic, phosphorus as the dopants. In another example, first, a single epitaxial layer may be grown using molecular-beam epitaxy, or related techniques on the substrate; and then subsequently, a portion of this epitaxial layer is doped using p-type dopants to form the epitaxial layer 136 and then n-type dopants may be doped to form the epitaxial layer 115.

Following the step 310, the method 300 proceeds to a step 320 (FIG. 2(b)) that includes depositing a dry film or a photoresist film 117 on the top side 116 using a suitable coating process, which is followed by curing, descum, and the like, which is further followed by lithography technology to form a pattern that is then used in an etching processes, such as a dry etch and/or a wet etch of the epitaxial layer 115, to form the sloped surface 113 on the top side 116.

The step 320 succeeds with step 330 (FIG. 2(c)) that includes depositing gate dielectric layer 124 and forming gate electrode 118 that is covered with the insulating layer 138. The gate dielectric layer 124, in some examples, includes silicon dioxide and can be deposited on the top side 116 using thermal oxidation process. The step 330 further includes fabricating the gate electrode 118, which is formed by first depositing—using chemical vapor deposition—a polysilicon layer (not expressly shown in FIG. 2(c)) over the dielectric layer 124. The deposited polysilicon is patterned to form the gate electrode 118. In some examples, before patterning the polysilicon above, an insulation layer may be deposited on the polysilicon using chemical vapor deposition, or related techniques. Following the deposition of the insulation layer, both the insulation and polysilicon layers may be patterned to form the insulation layer 138 and gate electrode 118, respectively. The insulating layer 138 may comprise $SiO_2$ or $SiO_xN_y$. In some examples, insulating layer 138 can comprise several layers of insulating materials that collectively form the insulating layer 138. The portion of the insulating layer 138 on the sidewalls of the gate electrode 118 is sometime referred to as spacers. In some examples, spacer formation step may be a separate step in which a dielectric film, such as silicon dioxide, is deposited by chemical vapor deposition process and then etched away by an anisotropic dry etching process after patterning the polysilicon layer.

In some examples, the gate electrode 118 may also include a silicide layer (not expressly shown in FIG. 2(c)) that is deposited—using chemical vapor deposition—between the above-described polysilicon and insulation layer before the polysilicon is patterned. In such examples, polysilicon and silicide layers are patterned together with or without insulating layer 138 as described above. The silicide layer may be comprised of a transition metal silicide and can include titanium, tungsten, and cobalt.

Step 330 is followed by a step 340 (FIG. 2(d)) that includes implanting, using ion implantation techniques, p-type dopants (e.g., boron) in the epitaxial layer 115 near the gate electrode 118 to form a body region 133. Following ion implantation, the device at this stage is annealed to disperse the implanted ions into the epitaxial layer 115. Following annealing, the overall area of the body region 133 relative to the overall area of the body region 133 shown in FIG. 2(d) expands/increases. This increased area is depicted in FIG. 2(e). In some examples, the body region 133 is doped to a dopant concentration of $5\times10^{16}$ to $1\times10^{18}$ atoms/$cm^3$.

After the step 340, the method 300 proceeds to a step 350 (FIG. 2(f)) that includes using ion implantation techniques, implanting n-type dopants (e.g., phosphorus, or arsenic) in the body region 133 and epitaxial layer 115 to form n-type doped regions 135, 127, respectively. Before the ion implantation technique is implemented, a dry film or a photoresist pattern 117 is formed on the surface of the gate dielectric layer 124 and the insulating layer 138 using a suitable lithography process to expose the surfaces in which the ions are implanted. After ion implantation, the device is annealed. Annealing disperses the implanted ions and increases the area of the implanted regions. These increased areas of the n-type doped regions are depicted in FIG. 2(g). The annealed n-type doped region 127 forms the drain implant region 128 (FIG. 2(g)). In some examples, these n-type doped regions are doped to a dopant concentration of $1\times10^{18}$ to $5\times10^{19}$. In some examples, step 350 may be followed by a field plate oxide deposition to increase the thickness of layer 124 in a field plate area (outside of the gate area).

Following the completion of the step 350, the method 300 proceeds to a step 360 (FIG. 2(h)) that includes forming a deep trench 140. The deep trench 140 reduces the area of the body region 133 (FIG. 2(f)) resulting in the first doped region 132 (FIG. 2(h)). Similarly, forming the deep trench 140 reduces the area of the n-type doped region 135 (FIG. 2(f)) resulting in source implant region 130 (FIG. 2(h)). Furthermore, forming the deep trench 140 reduces the area of the epitaxial layer 115 (FIG. 2(e)) resulting in second doped region 126. The deep trench 140, in some examples, is formed entirely through the epitaxial layer 114 and, optionally, partially into the semiconductor substrate 112, such as to a depth of 0.5 to 1.0 um into substrate 112. In some examples, a highly doped contact implant region (not expressly shown in FIG. 2(h)) may be formed in the substrate 112 having a high p-type dopant concentration of over $1\times10^{19}$ atoms/$cm^3$. This implant region may have a depth of about 0.2-0.5 um.

After etching the deep trench 140 through epitaxial layer 114, the method 300 moves to a step 370 that includes forming the continuous conductive layer 154 as shown in FIG. 2(i). In one example, the continuous conductive layer 154 is formed by chemical vapor deposition of, for example, Ti/TiN, which is subsequently patterned to form the source electrode 151, the gate shield 150, and the field plate 152. The continuous conductive layer 154, in some examples, includes one or more stacked conductive layers or materials with uniform thickness between about 0.1-0.3 um. The step 370 also includes—after the formation of the continuous conductive layer 154—depositing an insulation layer 144 to cover the top surface of the continuous conductive layer 154 and the exposed portion of the gate dielectric layer 124 (FIG. 2(j)). This insulation layer 144 may comprise one or more dielectric layers, such as silicon dioxide, silicon oxy-nitride.

After formation of the insulation layer 144, the method 300 proceeds to step 380 (FIG. 2(k)) that includes forming the drain electrode 146 (also sometimes called a plug). The drain electrode 146 is formed by first etching the insulation layer 144 to expose a part of the drain implant region 128. Following that, a layer of metal, for example aluminum alloy to form the conducting metal stack 148 to cover insulation layer 144.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A semiconductor device, comprising:
a semiconductor substrate;
an epitaxial layer having a top side disposed on the semiconductor substrate, wherein the epitaxial layer has a source implant region, a drain implant region, a first doped region, and a second doped region, wherein the first doped region is adjacent to the source implant region and the second doped region is adjacent to the drain implant region, wherein the top side has a sloped surface over the second doped region;
a gate electrode supported by the top side, wherein the gate electrode is positioned such that the gate electrode is laterally displaced relative to the sloped surface;
a source electrode in contact with the source implant region; and
a drain electrode in contact with the drain implant region.

2. The semiconductor device of claim 1, wherein the semiconductor substrate includes silicon.

3. The semiconductor device of claim 2, wherein the semiconductor substrate is doped with p-type dopants.

4. The semiconductor device of claim 1, wherein the second doped region is doped with n-type dopants and has a concentration of $5 \times 10^{16}$ to $1 \times 10^{18}$.

5. The semiconductor device of claim 1, wherein an insulating material is disposed between the gate electrode, top side, and the source electrode.

6. The semiconductor device of claim 1, wherein an insulating material is disposed between the source electrode and the drain electrode.

7. The semiconductor device of claim 1, wherein the epitaxial layer includes a third doped region adjacent to both the first and second doped regions.

8. The semiconductor device of claim 1 further comprising a field plate supported by the epitaxial layer and coupled to the source electrode.

9. The semiconductor device of claim 1, wherein source and drain implant regions are doped with n-type dopants, wherein a doping concentration of source and drain implant regions is $1 \times 10^{18}$ to $5 \times 10^{19}$ atoms/cm$^3$.

10. A semiconductor device, comprising:
a semiconductor substrate;
an epitaxial layer having a top side disposed on the semiconductor substrate, wherein the epitaxial layer has a source implant region, a drain implant region, a first doped region, and a second doped region, wherein the first doped region is adjacent to the source implant region and the second doped region is adjacent to the drain implant region, wherein the top side has a sloped surface over the second doped region, and wherein the epitaxial layer includes a third doped region adjacent to both the first and second doped regions;
a gate electrode supported by the top side, wherein the gate electrode is positioned such that the gate electrode is laterally displaced relative to the sloped surface;
a source electrode in contact with the source implant region; and
a drain electrode in contact with the drain implant region, wherein the third doped region is doped with p-type dopants and has a concentration of $1 \times 10^{15}$ to $5 \times 10^{16}$ atoms/cm$^3$.

11. A method of fabricating a semiconductor device, comprising:
obtaining a semiconductor substrate including an epitaxial layer disposed over the semiconductor substrate;
forming a sloped surface in a top side of the epitaxial layer;
forming a gate electrode supported by the epitaxial layer, wherein the gate electrode is positioned such that the gate electrode is laterally displaced relative to the sloped surface;
forming a first doped region in the epitaxial layer, the first doped region having a first conductivity type;
forming source and drain implant regions in the epitaxial layer, the source and drain implant regions having a second conductivity type opposite the first conductivity type, wherein a third doped region of the first conductivity-type is located between the source and drain implant regions and the semiconductor substrate; and
forming source and drain electrodes.

12. The method of claim 11, wherein the source implant region is adjacent to the first doped region.

13. The method of claim 11, wherein the first doped region is doped using p-type dopants and has a doping concentration of $5 \times 10^{16}$ to $1 \times 10^{18}$ atoms/cm$^3$.

14. The method of claim 11, wherein source and drain implant regions are doped with n-type dopants, wherein a doping concentration of source and drain implant regions is $1 \times 10^{18}$ to $5 \times 10^{19}$ atoms/cm$^3$.

15. The method of claim 11 further comprising:
forming gate dielectric before forming the gate electrode, the gate electrode is disposed on the gate dielectric.

16. The method of claim 11, wherein the source and drain electrodes are in contact with source and drain implant regions, respectively.

17. The method of claim 11, wherein forming the source electrode also includes forming a field plate supported by the epitaxial layer.

18. The method of claim 11 further comprising forming a second doped region, wherein the drain implant region is adjacent to the second doped region.

19. A method of fabricating a semiconductor device, comprising:
obtaining a semiconductor substrate including an epitaxial layer disposed over the semiconductor substrate;

forming a sloped surface in a top side of the epitaxial layer;
forming a gate electrode supported by the epitaxial layer, the gate electrode being laterally displaced relative to the sloped surface;
forming a first doped region in the epitaxial layer, the first doped region having a first conductivity type;
forming source and drain implant regions in the epitaxial layer, the source and drain implant regions having a second conductivity type opposite the first conductivity type; and
forming source and drain electrodes.

* * * * *